United States Patent [19]

Beasom

[11] Patent Number: 4,720,739
[45] Date of Patent: Jan. 19, 1988

[54] DENSE, REDUCED LEAKAGE CMOS STRUCTURE

[75] Inventor: James D. Beasom, Melbourne Village, Fla.

[73] Assignee: Harris Corporation, Melbourne, Fla.

[21] Appl. No.: 798,242

[22] Filed: Nov. 8, 1985

[51] Int. Cl.[4] ............ H01L 27/12; H01L 27/02; H01L 45/00
[52] U.S. Cl. ............................. 357/49; 357/42; 357/2
[58] Field of Search .................. 357/49, 42, 2

[56] References Cited

U.S. PATENT DOCUMENTS

| | | | |
|---|---|---|---|
| 3,829,889 | 8/1974 | Allison et al. | 357/49 |
| 4,210,925 | 7/1980 | Morcom et al. | 357/49 |
| 4,468,414 | 8/1984 | Van Vonno | 357/49 |
| 4,510,518 | 4/1985 | Van Vonno | 357/49 |
| 4,570,330 | 2/1986 | Cogan | 357/49 |

OTHER PUBLICATIONS

Regh, J. "Fabrication of Two-Surface Devices" IBM Technical Disclosure Bulletin, vol. 9, No. 2, Jul. 1966, pp. 195–196.

Primary Examiner—Martin H. Edlow
Assistant Examiner—Robert P. Limanek
Attorney, Agent, or Firm—Antonelli, Terry & Wands

[57] ABSTRACT

In accordance with the present invention, the inability of ohmic coupling to dielectrically provide isolated regions from the bottom surface of a support substrate is provided by a modified dielectric isolation structure in which bottom portions of selected dielectrically isolated island regions are contiguous with the material of the semiconductor bulk by which the dielectrically isolated island regions are supported by way of apertures through the dielectric isolation at these bottom portions. As a result, the supporting material of the bulk can be used to provide an ohmic coupling path from electrodes on the bottom surface of the wafer to the semiconductor material of selected island regions. For those dielectrically isolated regions, other than the selected regions, having a conductivity type opposite to that of the support substrate, complete dielectric isolation from the substrate is maintained, to prevent the existence of well-to-substrate PN junctions.

44 Claims, 7 Drawing Figures

DENSE, REDUCED LEAKAGE CMOS STRUCTURE

FIELD OF THE INVENTION

The present invention relates to semiconductor devices and is particularly directed to an arrangement for providing an ohmic conductor path from the bottom surface of a support substrate to selected ones of dielectrically isolated complementary device regions formed in the substrate, and to a method of manufacturing the same.

BACKGROUND OF THE INVENTION

Integrated circuit architectures comprising complementary types of devices, such as the opposite conductivity type regions of CMOS circuit structures, may typically contain one polarity type of device in the semiconductor bulk, while a second polarity type of device is contained in a well region having a conductivity type opposite to that of the substrate in which the well is formed, the well region defining a PN junction with the opposite conductivity type semiconductor material of the bulk. This PN junction creates several problems, including SCR latch up and significant leakage current through the large surface area defined between the well and the bulk. Because of these problems, bulk CMOS structures cannot be used in severe environments such as high operating temperatures and ionizing radiation. To eliminate these shortcomings of conventional CMOS well region structures, dielectrically isolated configurations, wherein the P and N regions are dielectrically isolated from one another (as by way of an oxide layer between the material of the well region and the bulk) have been employed. (Other methods of achieving dielectric isolation include providing silicon on an insulator base (e.g. silicon on sapphire (SOS)), or by forming one of the regions in a semiconductor layer which is separated from the bulk material by an insulator layer therebetween.

Now, although dielectric isolated structures obviate the above-mentioned drawbacks, they suffer from a significant limitation in that they do not provide ohmic coupling between the bottom surface of the support substrate and the device regions. This shortcoming constitutes a severe impediment to the production of dielectrically isolated implementations of complex circuit architectures, such as microprocessors, the design layout for which may take several man years.

SUMMARY OF THE INVENTION

In accordance with the present invention, the inability of conventional dielectrically isolated circuit architectures to provide ohmic coupling to the isolated regions from the bottom surface of the chip is resolved by a modified dielectric isolation structure in which the bottom portions of selected dielectrically isolated island regions are contiguous with the material of the semiconductor bulk by which the dielectrically isolated island regions are supported by way of apertures through the dielectric isolation at these bottom portions. As a result, the supporting material of the bulk can be used to provide an ohmic coupling path from electrodes on the bottom surface of the wafer to the semiconductor material of selected island regions. For those dielectrically isolated regions, other than the selected regions, having a conductivity type opposite to that of the support substrate, complete dielectric isolation from the substrate is maintained, to prevent the existence of well-to-substrate PN junctions.

In effect, the ohmic coupling of the substrate to the bottom portions of island regions having the same conductivity type as the substrate not only permits conductive access to the island regions from the bottom surface of the chip, but also increases the effective surface area at the top of the chip for ohmic contact connections from the substrate to selected portions of the selected island regions, thereby providing a considerable improvement in circuit layout density. Moreover, the ohmic coupling scheme of the present invention allows the use of wider current supply conductors for a given current density ground rule, which is particularly important in high temperature circuits for which electromigration conductor failures occur at lower current density than for circuits operated at lower temperatures.

In accordance with a preferred process for fabricating the selectively apertured dielectrically isolated island regions, an oxidation masking material, such as silicon nitride, is selectively patterned on a layer of silicon oxide overlying a semiconductor layer, such as a layer of silicon, in which the island regions are to be formed. The layer of silicon oxide is also selectively patterned (before or after the nitride pattern is formed) to form a moat etch mask for the underlying silicon. After etching a moat pattern in the silicon, isolation oxidation of the silicon is carried out. The oxidation-masking layer of silicon nitride is then removed, and the isolation oxidation layer is etched so as to expose the surface of the silicon beneath that portion of the oxidation layer previously masked by the nitride and which thereby has a reduced thickness compared with other portions of the oxidation layer. This nitride removal and etch step is followed by growth of a layer of conductive polycrystalline silicon layer to be used as the support substrate. The original silicon is then lapped and polished to the desired depth to yield a conductive substrate support structure having a plurality of dielectric isolated island regions the bottom portions of selected ones of which (as defined by the nitride pattern) are contiguous with the substrate and thereby capable of being ohmically connected with contacts on either surface (top or bottom) of the chip.

As a further aspect of the invention, for the selected island regions, a layer of polycrystalline or amorphous silicon, formed by low pressure chemical vapor deposition, may be formed between the conductive substrate and the dielectric isolation layer. This additional (initially undoped) layer provides a buffer region which is doped by out diffusion from the substrate and which effectively limits the doping in the island region due to substrate dopant out diffusion.

DETAILED DESCRIPTION

Figure 1:
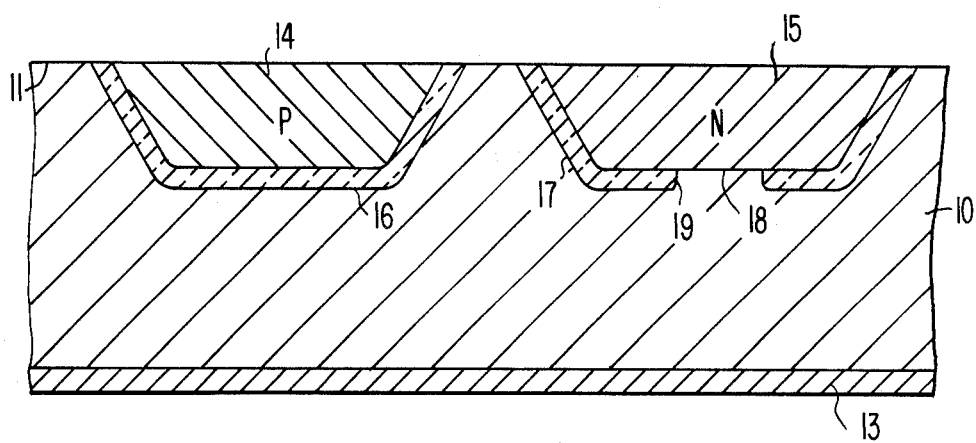
FIG. 1 is a diagrammatic cross-sectional illustration of a semiconductor structure having dielectric isolated complementary island regions with selective ohmic connection to the bottom surface of the substrate.

Referring now to FIG. 1, there is shown an N-type substrate 10 (for example an N-type polycrystalline silicon substrate) having a top surface 11 and a bottom surface 12. On the bottom surface 12 an electrode 13 (e.g. a power supply electrode) is provided. In respective surface portions of the top surface 11, a pair of monocrystalline regions 14 and 15 are disposed. Region 14 is a P-type region, dielectrically isolated from substrate 10 by a layer of dielectric isolation 16 therebetween. For this purpose, layer 16 may comprise a layer of silicon dioxide. Insulation layer 16 provides dielectric isolation between the monocrystalline P-type material 14 and the N-type substrate 10, as described above, so that there is effectively no PN junction formed between region 14 and the substrate 10.

Disposed in another portion of upper surface 11 of substrate 10, and spaced apart from region 14 by a portion of the substrate 10 therebetween, is an N-type monocrystalline region 15, which is surrounded on the sides thereof and a portion of the bottom thereof by a layer of dielectric isolation (e.g. oxide 17). Unlike oxide layer 16, which completely dielectrically isolates region 14 from the substrate 10 and thereby prevents the formation of a PN junction therebetween, dielectric isolation layer 17 has an opening or aperture 19 there through so that a portion of the bottom of N-type region 15 and the substrate 10 are contiguous with one another along a joining surface 18. Since the materials of N-type region 15 and the substrate 10 are of the same conductivity type, there is no PN junction formed between region 15 and the substrate 10 so that the problems of leakage current at surface 18 and the above mentioned latch-up phenomenon do not exist. By virtue of the opening 19 in dielectric isolation layer 17, it is possible to provide ohmic connection to region 15 from electrode 13 on the bottom surface 12 of the substrate 10, since there is effectively a continuous ohmic path in N-type semiconductor material from the electrode 13 to the region 15 by way of the opening 19 in oxide layer 17. Moreover, because the bottom portion of region 15 is contiguous with the N-type material of the substrate 10, both the top surface 11 and the bottom surface 12 of the substrate are available for ohmic connection to region 15. A more detailed illustration of the impact of the opening in the dielectric isolation for a region having a conductivity type corresponding to that of the substrate is illustrated in FIG. 2.

Figure 2:
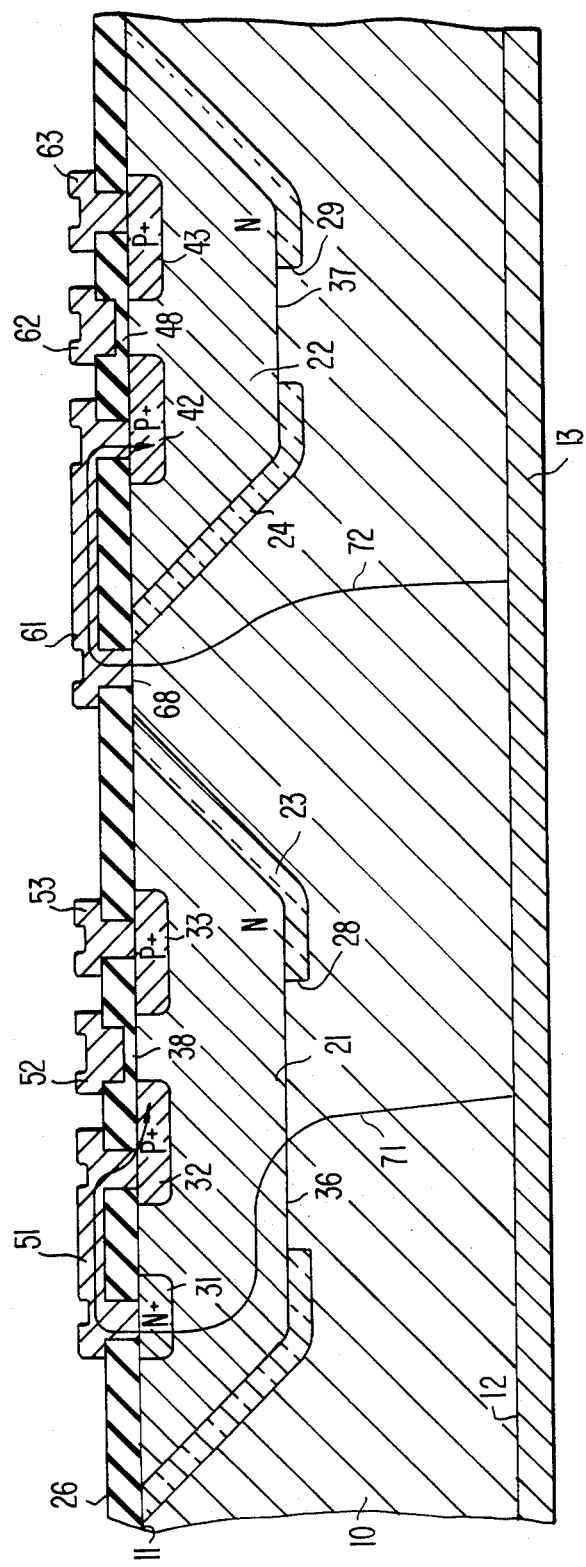
FIG. 2 is a diagrammatic cross-sectional illustration of a semiconductor structure having dielectric isolated island regions and showing flow paths for distributing current from the bottom surface of the substrate to the island regions.

More specifically, as shown in FIG. 2, a pair of N-type regions 21 and 22, similar to region 15 in FIG. 1, are as disposed in respective spaced apart portions of the top surface 11 of the N-type substrate 10. On the bottom surface 12 of the substrate an electrode 13 is provided. Region 21 is surrounded by a layer of dielectric isolation 23 having an opening 28 at the bottom thereof so that the N-type material of region 21 is contiguous with the substrate at joining surface 36. Similarly, N-type region 22 is contiguous with the N-type material of the substrate 10 by way of an opening 29 in a dielectric isolation layer 24 so that the material of region 22 is contiguous with the N-type material of the substrate 10 joining at surface 37. In region 21, there is also shown a circuit device, here a P channel field effect transistor, formed of respective P+ source and drain regions 32 and 33. Overlying the P-type channel between regions 32 and 33 is a gate oxide layer 38 atop which gate 52 is formed. On the top surface 11 of region 21 is a conductor layer 51 which extends through an opening in an oxide layer 26 overlying top surface 11 to contact source region 32 and through a second opening in oxide layer 26 contacting an N+ contact region 31. An additional opening in oxide layer 26 atop region 21 is shown as providing an area for a drain contact 53 to region 33.

N-type island region 22 is also shown as containing a P-channel field effect transistor having respective P+ source and drain regions 42 and 43 extending to surface 11. A thin gate oxide layer 48 is disposed on surface 11 atop the channel region between the source and drain regions 42 and 43, with a gate layer 62 overlying thin gate oxide 48. A drain contact 63 extends through an opening in oxide layer 26 to provide electrical connection to the drain region 43, while respective additional openings are disposed in oxide layer 26 to extend to source region 42 and to a surface portion 68 of the substrate 10, proper, between the dielectric isolated island regions 21 and 22. A conductor layer 61 is formed atop the oxide layer 26 and extends to surface region 68 of the substrate 10 and into contact with P+ source region 42.

Also shown in FIG. 2 are respective current flow lines 71 and 72 which illustrate the manner in which the current may be supplied from electrode 13 at the bottom surface 12 of the substrate 10 to regions at the top surface 11, either by way of the material of the substrate per se to the top surface 11, or through an opening in the dielectric isolation layers surrounding the N-type regions. As shown in FIG. 2, current flow path 71 extends from electrode 13 through the N-type material of the substrate 10, the N-type material of region 21, N+ region 31 and conductor 51 to source region 32. Current path flow line 72, on the other hand, extends through the material of the substrate 10 to a surface portion 68 thereof at which conductor 61 contacts the top surface 11 between isolated islands 21 and 22 and extends therefrom into contact with source region 42 within island 22. Because of the aperture 28 through the bottom portion of dielectric isolation oxide layer 23 surrounding island region 21, ohmic connection from electrode 13 on the bottom surface of substrate 10 to a circuit component (field effect transistor) within the island region 21 is readily accomplished by the addition of a contact region 31 at the surface 11 and a short conductor segment 51 from region 31 to region 32. Namely, bottom surface electrode 13 can be used as the power supply for the respective source regions 32 and 42 of the MOS transistors in the dielectric isolated island regions of the substrate. The provision of conductor 61, which extends from region 42 to surface contact area 68 illustrates how the substrate may be used to provide a power supply connection path.

Thus, by virtue of the opening in the bottom of the dielectric isolation layer, a considerable reduction in interconnect real estate is provided, on the one hand, and advantage is taken of the availability of the wafer for connection to components at the top surface of the dielectric isolated regions. It is also to be noted from the cross-sectional illustration of FIG. 2 that islands may be connected to remote top surface contacts through the openings in the dielectric isolation layers at the bottom surfaces thereof and the substrate material contiguous with the island regions through those openings. Namely, a current flow path is provided between island region 21 and conductor 61 through the opening 28 in dielectric isolation layer 23. Similarly, island region 22 is effectively connected to island region 21 via the openings 28 and 29 in dielectric isolation layers 23 and 24 and the substrate therebetween. Auspiciously, removal of a supply conductor from the top surface 11 results in a significant improvement in circuit layout density. As pointed out above, it also allows the use of wider supply current conductors for a given current density ground rule. This is especially important for high temperature circuits for which electromigration conductor failures occur at a lower current density then in the case for circuits operated at lower temperature. By using the bottom surface 12 for one of the contacts (electrode 13), the problem is avoided.

Referring now to FIGS. 3A–3D, there are shown respective illustrations of stages of manufacture of the configuration of the dielectrically isolated island regions, one of which has an opening in the dielectric isolation for providing ohmic contact to the substrate, as illustrated in the embodiment of FIG. 1.

Figure 3A:
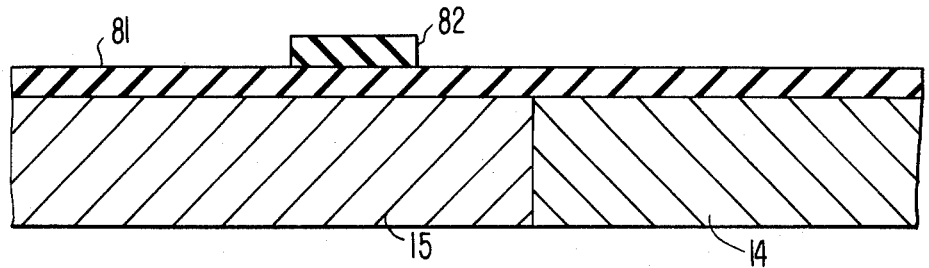
FIGS. 3A–3D diagrammatic cross-sectional illustrations of the semiconductor structure shown in FIG. 1 at respective stages of its manufacture.

For purposes of the present description it will be assumed that the respective P and N regions to be dielectrically isolated from one another will have been formed by the selective introduction of impurities into a monocrystalline layer prior to the isolation process. However, it is equally permissible to selectively dope the dielectrically isolated islands after the process to be described below. For the present example, after the selective introduction of impurities to form respective P and N regions in a monocrystalline layer, an oxide layer is grown over the entire surface of the wafer. This is shown in FIG. 3A wherein an oxide layer 81, having a thickness on the order of 2,000–10,000Å, is formed atop a monocrystalline N-type silicon layer 15 in which P-type impurities have been previously selectively introduced to form a region such as P-type region 14. An oxidation masking layer, such as a layer of silicon nitride, which may have a thickness on the order of 1,000–3,000Å, is then selectively formed over the oxide layer 81 to leave a patterned nitride layer 82 over that portion of the oxide layer 81 whereat an opening in the dielectric isolation of the N-type island region 15 is to be formed. A suitable photoresist masking layer is formed over oxide layer 81 and the oxide is selectively etched to leave a moat etching pattern in oxide layer 81. On the other hand, oxide layer 81 may be initially etched through a suitable moat etching mask and thereafter nitride layer 82 selectively formed thereon.

Figure 3B:
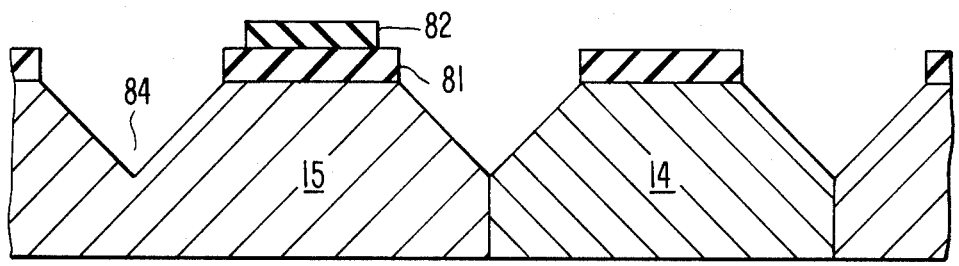
Figure 3C:
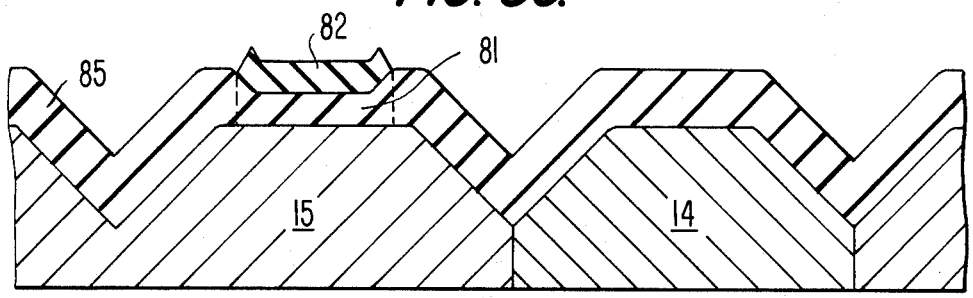
Figure 3D:
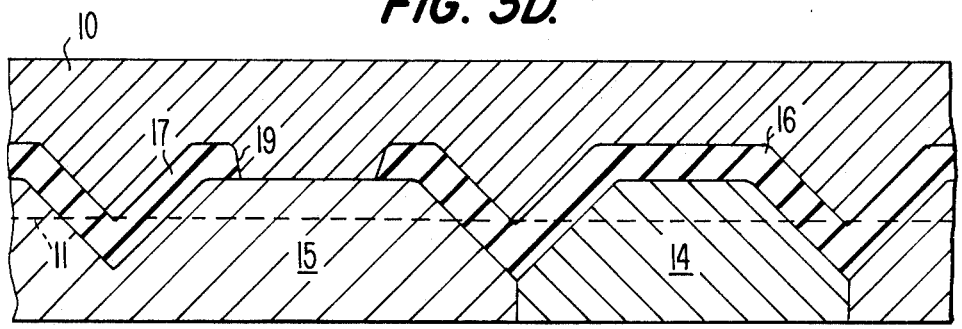

Next, as shown in FIG. 3B, the moncrystalline silicon layer is etched through the openings in the oxide layer 81 to form moats or grooves 84 in the monocrystalline silicon which define the geometries of the dielectrically isolated island regions to be produced. The exposed surfaces of the moat regions are then oxidized to form an oxide layer 85. During this oxidation step, shown in FIG. 3C the thickness of the oxide layer 85 is increased to a thickness greater than that of the oxide layer 81, so that a subsequent etching treatment, after removal of the nitride layer 82, will etch through the original thinner portion 81 of the oxide, to reach the N-type monocrystalline silicon 15 therebeneath. The nitride layer 82 is then stripped off and a non-selective oxide etch is performed to reduce the thickness of the oxide layer 85. As described above, this non-selective oxide etch removes that portion of the original oxide layer 81 beneath the stripped nitride 82, to leave opening 19, shown in FIG. 3D. A conductive substrate 10 (e.g. N-type polycrystalline silicon) is then grown atop the etched structure, substrate 10 being dielectrically isolated from original silicon layer 15, 14 by oxide layer 85, except at opening 19 through which substrate 10 is contiguous with silicon layer 15. Thereafter, the original monocrystalline material is lapped and polished to a surface line 11, shown in FIG. 3D. The inverted device configuration corresponds to that shown in FIG. 1, with P-type region 14 being completely surrounded by dielectric isolation oxide layer 16 (corresponding to the etched oxide 85 of FIG. 3C) while N-type region 15 is surrounded by dielectric isolation layer 17 with an opening 19 therethrough, so that the substrate 10 is contiguous through that opening 19 with the region 15.

Figure 4:
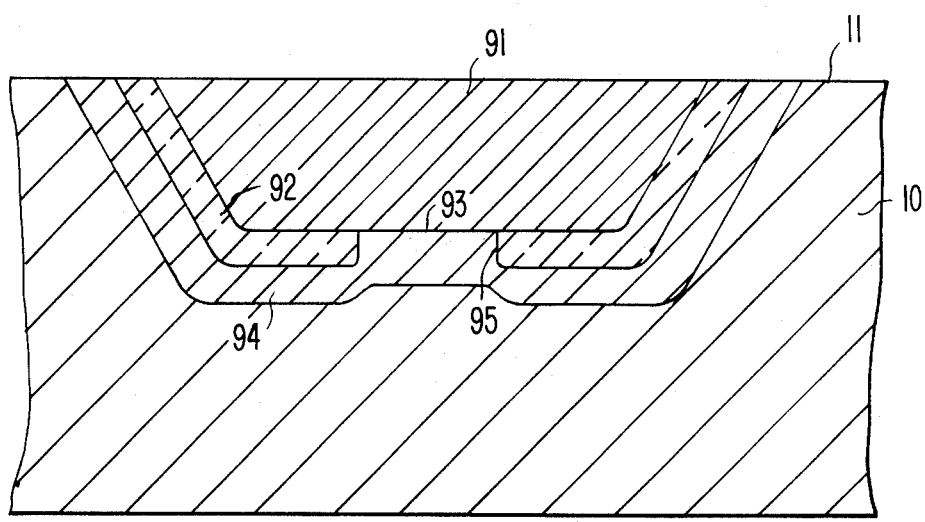
FIG. 4 is a diagrammatic cross-sectional illustration of a semiconductor structure having dielectric isolated island regions provided with a buffer layer between the dielectric isolation and the support substrate.

As mentioned previously, a modification of the embodiment of the invention shown in FIGS. 1–3 may include a buffer layer between the dielectric layer and the surrounding substrate which limits the depth of doping in the island region due to substrate dopant-out diffusion. This configuration is shown in FIG. 4 wherein a buffer layer 94 of amorphous or polycrystalline silicon is disposed between substrate 10 and island 91 and also between the dielectric region 92 and the substrate 10. The buffer layer 94, which may have a thickness on the order of 1,000–10,000Å extends through the opening 95 in the dielectric isolation layer 92 so that the N-type material of region 91 is contiguous with the buffer layer 94 at joining surface 93, rather than being contiguous with the material of the N-type substrate 10. In the process described above in conjunction with FIGS. 3A–3D, buffer layer 94 is selectively formed after the oxide etch through which opening 19 in oxide layer 85 is formed, during the etching of oxide layer 85 but prior to the formation of the substrate 10. This buffer layer may be undoped during its formation. When the substrate 10 is formed atop the etched end buffered layer formed structure, buffer region 94 becomes doped by out diffusion from the substrate of the conductivity type determining impurities of the substrate. This, in turn, limits the depth of penetration of dopant material from the substrate 10 proper through the opening 95 in the oxide layer 92 into the bottom of the region 91.

As will be appreciated from the foregoing description, the modified (bottom aperture) dielectric isolated island structure of the present invention overcomes the inability of conventionally dielectrically isolated integrated circuit architectures to provide ohmic coupling to the isolated island regions from the bottom surface of the chip. As a result the supporting material of the bulk can be used to provide an ohmic coupling path from electrodes on the bottom surface of the wafer to the semiconductor material of selected dielectrically isolated island regions.

The ohmic coupling of the substrate to the bottom portions of island regions having the same conductivity type as the substrate not only permits conductive access to the island regions from the bottom surface of the chip, but also increases the effective surface area at the top of the chip for ohmic contact connections from the substrate to selected portions of the selected island regions, thereby providing a considerable improvement in circuit layout density. Thus, the ohmic coupling scheme of the present invention allows the use of the substrate to distribute power supply voltage throughout the chip; it permits the use of wider current supply conductors for a given current density ground rule, which is particularly important in high temperature circuits for which electromigration conductor failures occur at lower current density than for circuits operated at lower temperatures. For those dielectrically isolated regions, other than the selected regions, having a conductivity type opposite to that of the support substrate, complete dielectric isolation from the substrate is maintained, to prevent the existence of well-to-substrate PN junctions.

While I have shown and described several embodiments in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. A semiconductor device comprising:
   a semiconductor substrate of a first conductivity type having a first surface;
   a first semiconductor region of said first conductivity type disposed in a first portion of said first surface of said substrate;
   a layer of dielectric material disposed between said first semiconductor region and said substrate so as to provide dielectric isolation between said first semiconductor region and said substrate, said first layer of dielectric material having an aperture therethrough so that the semiconductor material of said first semiconductor region is contiguous with semiconductor material of said substrate;
   first conductor means, ohmically coupled to said first surface; and
   a continuous ohmic coupling path extending from said first conductor means at said first surface to said first semiconductor region by way of said semiconductor substrate and the aperture through said first layer of dielectric material by way of which the semiconductor material of said first semiconductor region is contiguous with semiconductor material of said substrate.

2. A semiconductor device according to claim 1, wherein said first conductor means is coupled to a second portion of said first surface of said substrate spaced apart from said first portion thereof wherein said first semiconductor region is disposed.

3. A semiconductor device according to claim 1, further comprising
   a second semiconductor region, of a second conductivity type opposite said first conductivity type, disposed in a surface portion of said first semiconductor region; and wherein
   said first conductor means is ohmically connected to said second semiconductor region.

4. A semiconductor device according to claim 3, wherein said second semiconductor region is one of the source/drain regions of a field effect transistor formed within said first semiconductor region.

5. A semiconductor device according to claim 1, further comprising
   a second semiconductor region of said first conductivity type disposed in the second portion of said first surface of said substrate spaced apart from said first portion of said first surface of said substrate;
   a second layer of dielectric material disposed between said second semiconductor region and said substrate so as to provide dielectric isolation between said second semiconductor region and said substrate, said second layer of dielectric material having an aperture therethrough so that semiconductor material of said second region is contiguous with semiconductor material of said substrate;
   second conductor means ohmically coupled to said second portion of said first surface; and
   a continuous ohmic coupling path extending from said second conductor means through said second semiconductor region to said substrate contiguous therewith via the aperture in said second layer of dielectric material and, by way of said substrate, to said first semiconductor region, via the aperture in said first layer of dielectric material.

6. A semiconductor device according to claim 5, further comprising a third semiconductor region, of a second conductivity type opposite said first conductivity type, disposed in a surface portion of said second semiconductor region; and wherein
   said second conductor means is ohmically connected to said third semiconductor region.

7. A semiconductor device according to claim 6, wherein said third semiconductor region is one of the source/drain regions of a field effect transistor formed within said second semiconductor region.

8. A semiconductor device according to claim 5, wherein said second conductor means is further ohmically coupled to said substrate at said first surface thereof.

9. A semiconductor device according to claim 5, further comprising a third semiconductor region, of a second conductivity type opposite said first conductivity type, disposed in a surface portion of said first semiconductor region, and wherein said first conductor means is ohmically coupled to said third semiconductor region.

10. A semiconductor device according to claim 9, wherein said third semiconductor region is one of the source/drain regions of a field effect transistor formed within said first semiconductor region.

11. A semiconductor device according to claim 9, further comprising a fourth semiconductor region of said second conductivity type disposed in a surface portion of said second semiconductor region, and wherein said second conductive means is ohmically coupled to said fourth semiconductor region.

12. A semiconductor device according to claim 11, wherein said fourth semiconductor region is one of the source/drain regions of a field effect transistor formed within said second semiconductor region.

13. A semiconductor device according to claim 9, further comprising third conductor means ohmically coupled to a surface of said substrate other than said first surface of said substrate.

14. A semiconductor device according to claim 9, further comprising third conductor means disposed on a side of said substrate opposite the side containing said first surface thereof.

15. A semiconductor device comprising:
   a semiconductor substrate of a first conductivity type;
   a semiconductor region of said first conductivity type disposed in a first portion of a first surface of said substrate;
   a layer of dielectric material disposed between said semiconductor region and said substrate so as to provide dielectric isolation between said semiconductor region and said substrate, said layer of dielectric material having an aperture therethrough; and a buffer layer of semiconductor material containing a dopant of said first conductivity type having an impurity concentration less than that of said substrate and disposed in the aperture through said layer of dielectric material and being contiguous with said substrate and said semiconductor region.

16. A semiconductor device according to claim 15, wherein said buffer layer of semiconductor material is further disposed between said layer of dielectric material and said substrate.

17. A semiconductor device according to claim 15, wherein said buffer layer of semiconductor material comprises a polycrystalline semiconductor layer.

18. A semiconductor device according to claim 15, wherein said buffer layer of semiconductor material comprises an amorphous semiconductor layer.

19. A semiconductor device comprising:
a semiconductor substrate having a first surface;
a plurality of semiconductor island regions formed in spaced apart portions of said first surface of said substrate and being dielectrically isolated from said substrate by respective layers of dielectric material therebetweeen, at least one of said layers of dielectric material having an aperture therethrough so that semiconductor material of the respective at least one semiconductor island region isolated thereby is ohmically connected with semiconductor material of said substrate by way of said aperture;
first conductor means, ohmically coupled to said first surface
at least one continuous ohmic coupling path extending from first conductor means at said first surface to said at least one semiconductor island region by way of said semiconductor substrate and the respective aperture through said at least one of said layers of dielectric material by way of which the semiconductor material of said at least one semiconductor island region is contiguous with semiconductor material of said substate.

20. A semiconductor device according to claim 19, further including second conductor means disposed on the side of said substrate opposite the side thereof containing said first surface.

21. A semiconductor device according to claim 19, further including second conductor means ohmically coupled to one of said semiconductor island regions at said first surface.

22. A semiconductor device according to claim 19, wherein said one of said semiconductor island regions includes a further semiconductor region having a conductivity type opposite to that of said one island region and wherein said first conductor means is ohmically coupled to said further semiconductor region.

23. A semiconductor device according to claim 22, wherein said further semiconductor region is one of the source/drain regions of a field effect transistor formed within said one of said semiconductor island regions.

24. A semiconductor device comprising:
a semiconductor substrate of a first conductivity type having a first surface;
a semiconductor region of said first conductivity type disposed in a first portion of said first surface of said substrate;
a first layer of dielectric material disposed between said semiconductor region and said substrate so as to provide dielectric isolation between said semiconductor region and said substrate, said first layer of dielectric material having an aperture therethrough;
means, disposed in said aperture in said layer of dielectric material, for ohmically connecting said semiconductor region to said substrate;
first conductor means, ohmically coupled to said first surface; and
a continuous ohmic coupling path extending from said first conductor means at said first surface to said first semiconductor region by way of said semiconductor substrate and said ohmically connecting means disposed in said aperture in said first layer of dielectric material by way of which the semiconductor material of said first semiconductor region is ohmically coupled with semiconductor material of said substrate.

25. A semiconductor device according to claim 24, wherein said means comprises the semiconductor material of said substrate which extends through said aperture and is contiguous with semiconductor material of said first semiconductor region.

26. A semiconductor device according to claim 24, wherein said means comprises a layer of semiconductor material of said first conductivity type which is contiguous with said first semiconductor region and said substrate.

27. A semiconductor device according to claim 24, further including a conductor layer disposed on a surface of said substrate other than said first surface thereof.

28. A semiconductor device comprising:
a semiconductor substrate having a first surface;
a plurality of semiconductor island regions formed in spaced apart portions of said first surface of said substrate and being dielectrically isolated from said substrate by respective layers of dielectric material therebetween, at least two of said layers of dielectric material having respective apertures therethrough so that semiconductor material of the respective island regions dielectrically isolated thereby are ohmically coupled with semiconductor material of said substrate by way of said apertures;
at least one conductor means ohmically coupled to said first surface; and
respective continuous ohmic coupling paths extending from said respective island regions to said at least one conductor means by way of said respective apertures through said at least two of said layers of dielectric material and semiconductor material of said substrate.

29. A semiconductor device according to claim 28, wherein one of said at least one conductor means is ohmically coupled to one of said semiconductor regions.

30. A semiconductor device according to claim 28, wherein said at least one conductor means is ohmically coupled to a portion of said first surface of said substrate displaced from said spaced apart portions thereof.

31. A semiconductor device according to claim 28, further including second conductor means ohmically coupled to a surface of said semiconductor substrate other than said first surface thereof.

32. A semiconductor device comprising:
a semiconductor substrate of a first conductivity type having a first surface;

a first semiconductor region of said first conductivity type disposed in a first portion of said first surface of said substrate;

a layer of dielectric material disposed between said first semiconductor region and said substrate so as to provide dielectric isolation between said first semiconductor region and said substrate, said first layer of dielectric material having an aperture therethrough so that the semiconductor material of said first semiconductor region is contiguous with semiconductor material of said substrate;

first conductor means, ohmically coupled to said first semiconductor region at first surface; and a continuous ohmic coupling path extending from said first conductor means at said first surface through said first semiconductor region and the aperture through said first layer of dielectric material by way of which the semiconductor material of said first semiconductor region is contiguous with semiconductor material of said substrate and through said substrate.

33. A semiconductor device according to claim 32, further including second conductor means coupled to a second portion of said first surface of said substrate spaced apart from said first portion thereof wherein said first semiconductor region is disposed, said continuous ohmic coupling path extending from said first conductor means through said first semiconductor region, said aperture and through said substrate to said second conductor means.

34. A semiconductor device according to claim 32, further comprising a second semiconductor region, of a second conductivity type opposite said first conductivity type, disposed in a surface portion of said first semiconductor region; and wherein said first conductor means is ohmically connected to said second semiconductor region.

35. A semiconductor device according to claim 34, wherein said second semiconductor region is one of the source/drain regions of a field effect transistor formed within said first semiconductor region.

36. A semiconductor device according to claim 32, further comprising a second semiconductor region of said first conductivity type disposed in a second portion of said first surface of said substrate spaced apart from said first portion of said first surface of said substrate;

a second layer of dielectric material disposed between said second semiconductor region and said substrate so as to provide dielectric isolation between said second semiconductor region and said substrate, said second layer of dielectric material having an aperture therethrough so that semiconductor material of said second region is contiguous with semiconductor material of said substrate;

second conductor means ohmically coupled to said second semiconductor region at said second portion of said first surface; and a continuous ohmic coupling path extending from said second conductor means through said second semiconductor region and said substrate contiguous therewith via the aperture in said second layer of dielectric material and, by way of said substrate, to said first semiconductor region, via the aperture in said first layer of dielectric material.

37. A semiconductor device according to claim 36, further comprising a third semiconductor region, of a second conductivity type opposite said first conductivity type, disposed in a surface portion of said second semiconductor region; and wherein said second conductor means is ohmically connected to said third semiconductor region.

38. A semiconductor device according to claim 37, wherein said third semiconductor region is one of the source/drain regions of a field effect transistor formed within said second semiconductor region.

39. A semiconductor device according to claim 36, wherein said second conductor mean is further ohmically coupled to said substrate at said first surface thereof.

40. A semiconductor device according to claim 32, further comprising second conductor means ohmically coupled to a surface of said substrate other than said first surface of said substrate.

41. A semiconductor device comprising:

a semiconductor substrate of a first conductivity type having a first surface;

a first semiconductor region of said first conductivity type disposed in a first portion of said first surface of said substrate;

a layer of dielectric material disposed between said first semiconductor region and said substrate so as to provide dielectric isolation between said first semiconductor region and said substrate;

first conductor means, ohmically coupled to said substrate at said first surface thereof and to said first semiconductor region at said first surface;

a continuous ohmic coupling path extending from said first semiconductor region through said first conductor means at said first surface thereof and through said semiconductor substrate.

42. A semiconductor device according to claim 41, further including second conductor means ohmically coupled to a second surface of said substrate spaced apart from said first surface thereof, said continuous ohmic coupling path extending through said substrate to said second conductor means.

43. A semiconductor device according to claim 41, further comprising a second semiconductor region, of a second conductivity type opposite said first conductivity type, disposed in a surface portion of said first semiconductor region; and wherein said first conductor means is ohmically connected to said second semiconductor region.

44. A semiconductor device according to claim 43, wherein said second semiconductor region is one of the source/drain regions of a field effect transistor formed within said first semiconductor region.

* * * * *